US009417287B2

(12) United States Patent  (10) Patent No.: US 9,417,287 B2
Chandra et al.  (45) Date of Patent: Aug. 16, 2016

(54) SCHEME FOR MASKING OUTPUT OF SCAN CHAINS IN TEST CIRCUIT (71) Applicant: Synopsys, Inc., Mountain View, CA (US)

(72) Inventors: Anshuman Chandra, Sunnyvale, CA (US); Subramanian B. Chebiyam, Sunnyvale, CA (US); Jyotirmoy Saikia, Bangalore (IN); Parthajit Bhattacharya, Bangalore (IN); Rohit Kapur, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/254,423

(22) Filed: Apr. 16, 2014

(65) Prior Publication Data

US 2014/0317463 A1  Oct. 23, 2014

Related U.S. Application Data (60) Provisional application No. 61/813,101, filed on Apr. 17, 2013.

(51) Int. Cl.
*G01R 31/3185* (2006.01)
*G01R 31/3177* (2006.01)
*G06F 11/27* (2006.01)
*G01R 31/3187* (2006.01)

(52) U.S. Cl.
CPC .... *G01R 31/318547* (2013.01); *G01R 31/3177* (2013.01); *G01R 31/3185* (2013.01); *G01R 31/3187* (2013.01); *G01R 31/318536* (2013.01); *G01R 31/318541* (2013.01); *G01R 31/318544* (2013.01); *G01R 31/318566* (2013.01); *G06F 11/27* (2013.01)

(58) Field of Classification Search
USPC .................. 714/726, 727, 729, 733
See application file for complete search history.

(56) References Cited

U.S. PATENT DOCUMENTS

| | | |
|---|---|---|
| 5,475,695 A | 12/1995 | Caywood et al. |
| 6,122,756 A | 9/2000 | Baxter |
| 6,185,707 B1 | 2/2001 | Smith et al. |
| 6,288,955 B1 | 9/2001 | Shibano et al. |
| 6,418,545 B1 * | 7/2002 | Adusumilli .................... 714/729 |
| 6,557,129 B1 * | 4/2003 | Rajski ............ G01R 31/318547 |
| | | 714/729 |
| 6,618,830 B1 | 9/2003 | Balachandran et al. |
| 7,139,948 B2 | 11/2006 | Rearick et al. |
| 7,370,254 B2 * | 5/2008 | Rajski ............ G01R 31/318566 |
| | | 714/726 |
| 7,859,285 B2 | 12/2010 | Sheu et al. |

(Continued)

OTHER PUBLICATIONS

Wohl et al., Fully X-tolerant Combinational Scan Compression, 2007, IEEE.*

(Continued)

*Primary Examiner* — Cynthia Britt
*Assistant Examiner* — Sazzad Hossain
(74) *Attorney, Agent, or Firm* — Fenwick & West LLP (57) ABSTRACT Operating a scan chain of a test circuit of an integrated circuit to have either a single fanout or multiple fanout to a compressor. The test circuit receives a fanout control signal for configuring the fanout of the scan chain. If the fanout control signal indicates configuring of the scan chain with a single fanout, the output of the scan chain is sent to one input of a compressor. If the fanout control signal indicates configuring of the scan chain with multiple fanout, the output of the scan chain is sent to multiple inputs of the compressor.

20 Claims, 11 Drawing Sheets

(56) References Cited

U.S. PATENT DOCUMENTS

| | | | |
|---|---|---|---|
| 8,065,651 | B2 | 11/2011 | Kapur et al. |
| 8,261,142 | B2 | 9/2012 | Guo et al. |
| 8,694,951 | B1 | 4/2014 | Prasanna et al. |
| 2004/0230884 | A1* | 11/2004 | Rajski ............ G01R 31/318566 714/742 |
| 2005/0055617 | A1* | 3/2005 | Wang ............. G01R 31/318335 714/727 |
| 2007/0061637 | A1 | 3/2007 | Ward et al. |
| 2007/0143651 | A1 | 6/2007 | Kiryu |
| 2007/0179731 | A1 | 8/2007 | Suri et al. |
| 2007/0234169 | A1* | 10/2007 | Rajski ............ G01R 31/318547 714/742 |
| 2008/0294955 | A1 | 11/2008 | Kapur et al. |
| 2008/0301510 | A1 | 12/2008 | Kapur et al. |
| 2009/0240458 | A1 | 9/2009 | Desineni et al. |
| 2010/0017760 | A1 | 1/2010 | Kapur et al. |
| 2010/0192030 | A1 | 7/2010 | Kapur et al. |
| 2011/0258498 | A1 | 10/2011 | Chandra et al. |

OTHER PUBLICATIONS

Chakrabarty, K. et al., "Test Planning for Modular Testing of Hierarchical SOCs," IEEE Transactions on Computer-Aided Design of Integrated Circuits and Systems, Mar. 2005, pp. 435-448, vol. 24, No. 3.

Chandra, A. et al., "Scalable Adaptive Scan (SAS)," EDAA, 2009, 6 pages.

Devanathan, V.R. et al., "Reducing SoC Test Time and Test Power in Hierarchical Scan Test: Scan Architecture and Algorithms," IEEE 20th Int'l Conference on VLSI Design, VLSID'07, 2007, 6 pages.

Dutta et al., "Using Limited Dependence Sequential Expansion for Decompressing Test Vectors," IEEE Int'l Test Conference, 2006, Paper 23.1, pp. 1-9.

Gonciari, P.T. et al., "Compression Considerations in Test Access Mechanism Design," IEE Proc.-Comput. Digit. Tech, Jan. 2005, pp. 89-96, vol. 152, No. 1.

Iyengar, V. et al., "A Unified SOC Test Approach Based on Test Data Compression and TAM Design," Proceedings of the 18$^{th}$ IEEE International Symposium on Defect and Fault Tolerance in VLSI Systems, (DFT'03), IEEE, 2003, 8 pages.

Iyengar, V. et al., "Test Access Mechanism Optimization, Test Scheduling, and Tester Data Volume Reduction for System-on-Chip," IEEE Transactions on Computers, Dec. 2003, pp. 1619-1632, vol. 52, No. 12.

Kapur, R. et al., "Manufacturing Test of SoCs," Proceedings of the 11th Asian Test Symposium, (ATS'02), IEEE, 2002, 3 pages.

Larsson, A. et al., "Test-Architecture Optimization and Test Scheduling for SOCs with Core-Level Expansion of Compressed Test Patterns," EDAA, 2008, pp. 188-193.

Nadeau-Dostie, B. et al., "Improved Core Isolation and Access for Hierarchical Embedded Test," IEEE Design & Test of Computers, Jan./Feb. 2009, pp. 18-25.

Remmers, J. et al.,"Hierarchical DFT Methodology—A Case Study," ITC International Test Conference, IEEE, 2004 Paper 30.2, pp. 847-856.

Sinanoglu, O. et al., "A Non-Intrusive Isolation Approach for Soft Cores," EDAA, 2007, pp. 27-32.

Srinavasan, P. et al., "Hierarchical DFT with Combinational Scan Compression, Partition Chain and RPCT," 2010 IEEE Annual Symposium on VLSI, IEEE, 2010, pp. 52-57.

Su et al., "Multiple Path Sensitization for Hierarchical Circuit Testing," IEEE 1990 Int'l Test Conference, Paper 6.2, pp. 152-161.

Su et al., "Computer-Aided Design of Pseudoexhaustive BIST for Semiregular Circuits," 1990 IEEE International Test Conference, 1990, Paper 30.4, pp. 680-689.

Wohl, P. et al., "Fully X-tolerant Combinational Scan Compression," 2007 IEEE International Test Conference, IEEE, 2007, Paper 6.1, pp. 1-10.

Wohl, P. et al., "Minimizing the Impact of Scan Compression," 25th IEEE Vlsi Test Symposium (VTS'07), IEEE, 2007, 8 pages.

Xu, Q. et al., "Modular and Rapid Testing of SOCs With Unwrapped Logic Blocks," IEEE Transactions on Very Large Scale Integration (VLSI) Systems, Nov. 2005.

* cited by examiner

SCHEME FOR MASKING OUTPUT OF SCAN CHAINS IN TEST CIRCUIT

CROSS REFERENCE TO RELATED APPLICATION

This application claims the benefit of U.S. Provisional Application No. 61/813,101, filed Apr. 17, 2013, which is incorporated by reference herein in its entirety.

BACKGROUND

1. Field of the Disclosure

The present disclosure relates to masking one or more scan chains in a testing circuit for testing an integrated circuit to prevent propagation of unknown values.

2. Description of the Related Art

A defect is an error introduced into an integrated circuit (IC) during a semiconductor manufacturing process. Defects that alter the behavior of the IC can be described by a mathematical fault model. During testing of the IC, a test pattern is applied to the IC and logic value outputs from the IC are observed. When the IC is operating as designed, the logic value output coincides with expected output values specified in test patterns. A fault in the IC is detected when the logic value output is different than the expected output.

Automatic Test Pattern Generation (ATPG) refers to an electronic design automation (EDA) process that generates a set of test patterns for applying to an IC to detect faulty behavior caused by defects in the IC. The generated patterns are used to test semiconductor devices after manufacture, and in some cases to assist with determining the cause of fault. The fault model may be used to generate the test patterns that effectively covers certain types of faults with a fewer number of test patterns.

To receive and detect faults in the IC, the IC includes a test circuit that receives and applies the test patterns to one or more scan chains. A scan chain includes a row of multiple scan flops that output a certain logic value when the test pattern is applied. An unexpected output of a scan flop is indicative of certain faults or defects in circuit components associated with the scan flop. Outputs of multiple scan flops may be compressed into a bit stream to reduce data bandwidth and pins associated with the testing of IC.

An unknown value in the output of a scan chain is designated "X" to represent that it could be either a logic 0 or logic 1 in the expected scan-out data stream. X response values in output of scan chains are undesirable because it is unknown whether the design is faulty based on the scan output. In standard scan testing without compression, X values are simply ignored. However, when scan data is compressed, X values can interfere with known values and reduce fault coverage. Therefore, compression of scan output can reduce observability and worsen test coverage.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
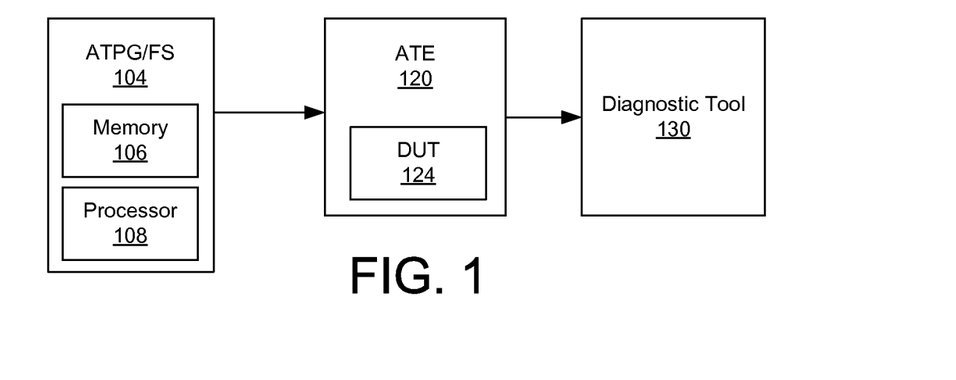
FIG. 1 is a block diagram illustrating a system for testing and diagnosing a device under test (DUT), according to one embodiment.

FIG. 1 is a block diagram illustrating a system 100 for testing and diagnosing a device under test (DUT) 124, according to one embodiment. DUT 124 is an integrated circuit (IC) that is being tested for faults in its fabrication process. The system 100 may include, among other components, an automatic test pattern generator/fault simulator (ATPG/FS) 104, an automatic test equipment (ATE) 120, and a diagnostic tool 130. One or more of these components may be combined into a single product or device.

ATPG/FS 104 generates test patterns provided to ATE 120 and scan-out values corresponding to the test patterns for detecting faults in DUT 124. In some embodiments, ATPG/FS 104 includes a memory 106 that stores instruction for generating the test patterns. ATPG/FS 104 may also include a processor 108 that reads the instructions stored in memory 106 and executes the instructions to generate test patterns and control signals to be fed into DUT 124. Scan-out values represent the expected output from a faultless integrated circuit when provided with the test patterns. A test pattern includes scan-in data and control data for controlling test operation in DUT 124, as described below in detail with reference to FIG. 3A. ATE 120 provides the test patterns as scan-in data and control data to DUT 124, and captures output from DUT 124. The captured output from DUT 124 is compared with scan-out values. ATE 120 then generates fault data indicating the difference in the scan-out values and the output from DUT 124.

ATE 120 then sends fault data to diagnostic tool 130 to localize and diagnose the cause of faults in DUT 124. If a fault is detected based on an unexpected output of DUT 124, diagnostic tool 130 may request ATPG/FS 104 to generate further test patterns to localize or specify a scan flop associated with the unexpected value.

Figure 2:
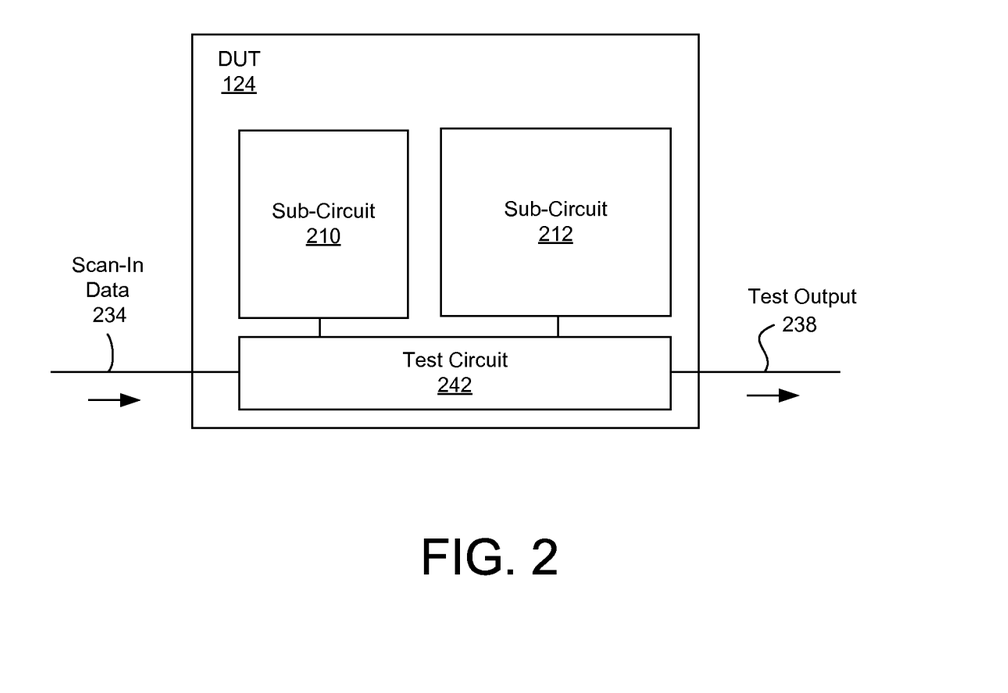
FIG. 2 is a block diagram of a DUT including a test circuit, according to one embodiment.

FIG. 2 is a block diagram of DUT 124 including a test circuit 242 for performing testing of sub-circuits in DUT 124, according to one embodiment. DUT 124 may include, among other components, one or more sub-circuits 210, 212 and test circuit 242. DUT 124 may have a plurality of pins connected to the sub-circuits 210, 212 and test circuit 242. Since the number of pins on an integrated circuit (IC) is limited, pins are often multiplexed to perform more than one function. One of such multiplexed function is receiving scan-in data 234 (i.e., test patterns) from ATPG/FS 104 and sending test output data 238 (i.e., an output in response to the test patterns) to diagnostic tool 130.

Test circuit 242 includes hardware circuitry providing scan-in data 234 to chains of scan flops. Test circuit 242 also generates test output data 238 corresponding to scan-in data 234. It is generally advantageous for test circuit 242 to be connected to fewer pins, perform testing at a high speed, and obtain higher fault coverage with fewer test patterns.

Although test circuit 242 is illustrated in FIG. 2 as testing both sub-circuits 210, 212, more than one test circuit may be provided in DUT to separately test a certain sub-circuit. In embodiments with multiple test circuits, each test circuit may be connected to the same or different pins.

Figure 3A:
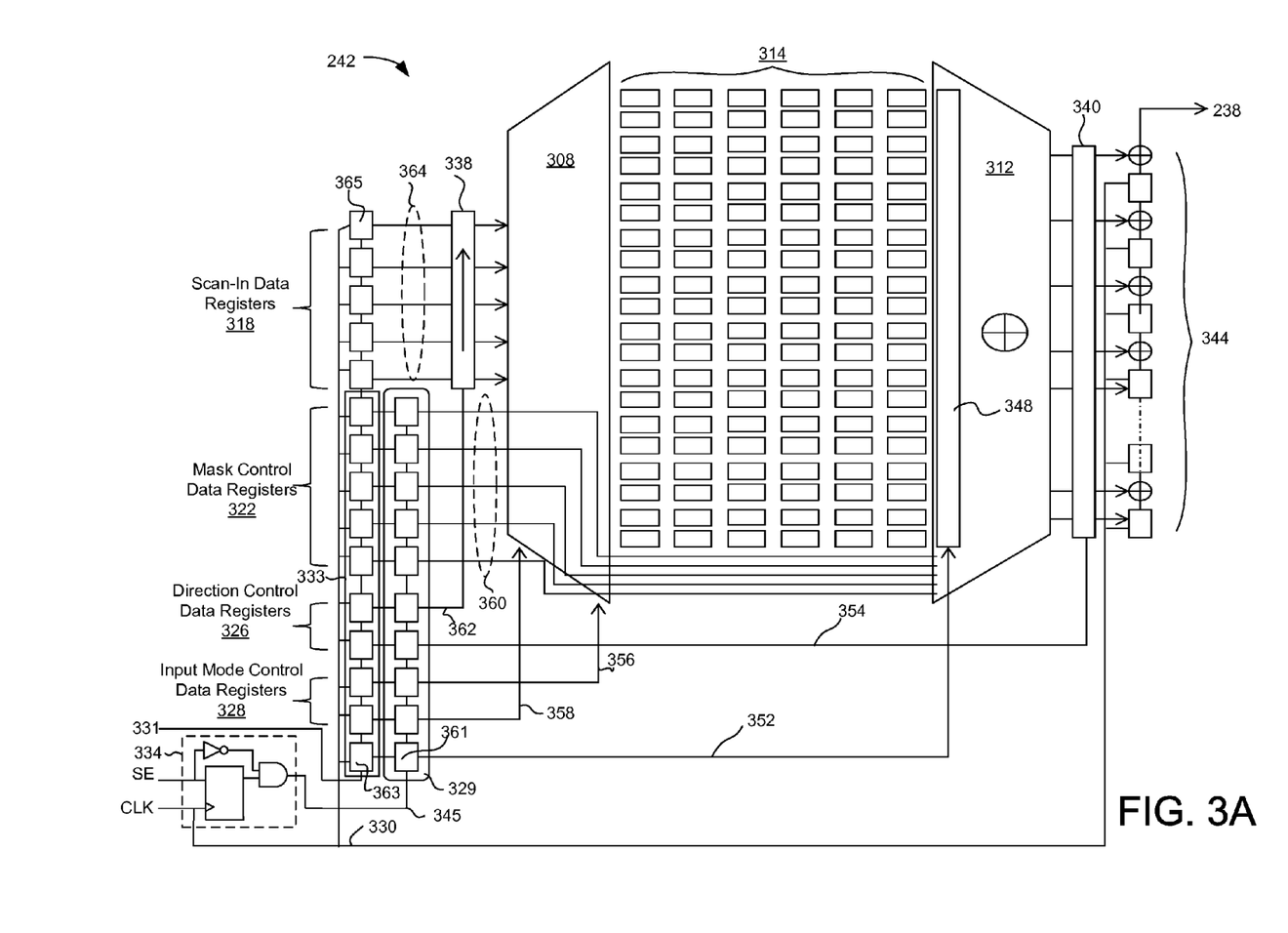
FIG. 3A is a circuit diagram of a test circuit in the DUT, according to one embodiment.

FIG. 3A is a circuit diagram of test circuit 242 in the DUT 124, according to one embodiment. Test circuit 242 may include, among other components, a decompressor 308, a compressor 312, chains of scan flops 314, input registers 318, 322, 326, 328, 329, output register 344, input direction block 338, output direction block 340, and control logic 334. Test circuit 242 provides scan-in data 234 to the scan flops 314 via input direction block 338 and generates test output data 238 by operating circuit components according to control values stored in current control registers 329.

Control logic 334 synchronizes the operation of components in test circuit 242 by providing a clock signal via line 345. When a clock signal is input to current control registers 329, the bit values in control registers 333 are loaded onto current control registers 329. The control circuit receives scan enable (SE) signal and clock signal (CLK). SE signal indicates that the test circuit 242 should be activated to perform testing operation. CLK signal is used for synchronizing the operation of various components in test circuit 242. Control logic 334 includes a flip-flop, an AND gate and an inverter but different combinations or structures may also be used.

Bit values of scan-in data and control data are stored in corresponding registers by sequentially shifting bit values from register 363 at the bottom of the register chain up to a scan-in data registers 365 at the top of the register chain as bits for the current test pattern is received via line 331. Although a single line 331 is illustrated in FIG. 3A receiving the scan-in data and the control data, more than one line may be used to transmit scan-in data and the control data to corresponding registers. Registers 333 shift values from scan-in data received via line 331 to scan-in data registers 318. At the end of the shifting process to store scan-in data in scan-in data registers 318, SE signal goes low and control logic 334 drives current registers 329 via line 345. Current registers 329 stores control values until the next capture clock so that decompressor 308 and compressor 312 can be controlled without undergoing change with every shift of scan-in data. That is, registers 333 enable control values to be shifted to register 329 only once per pattern.

Scan-in data registers 318 store bit values for scan-in data that is fed to decompressor 308 via line 364 and input direction block 338. The stored scan-in data is sent via lines 364 and input direction block 338 to decompressor 308.

Figure 3B:
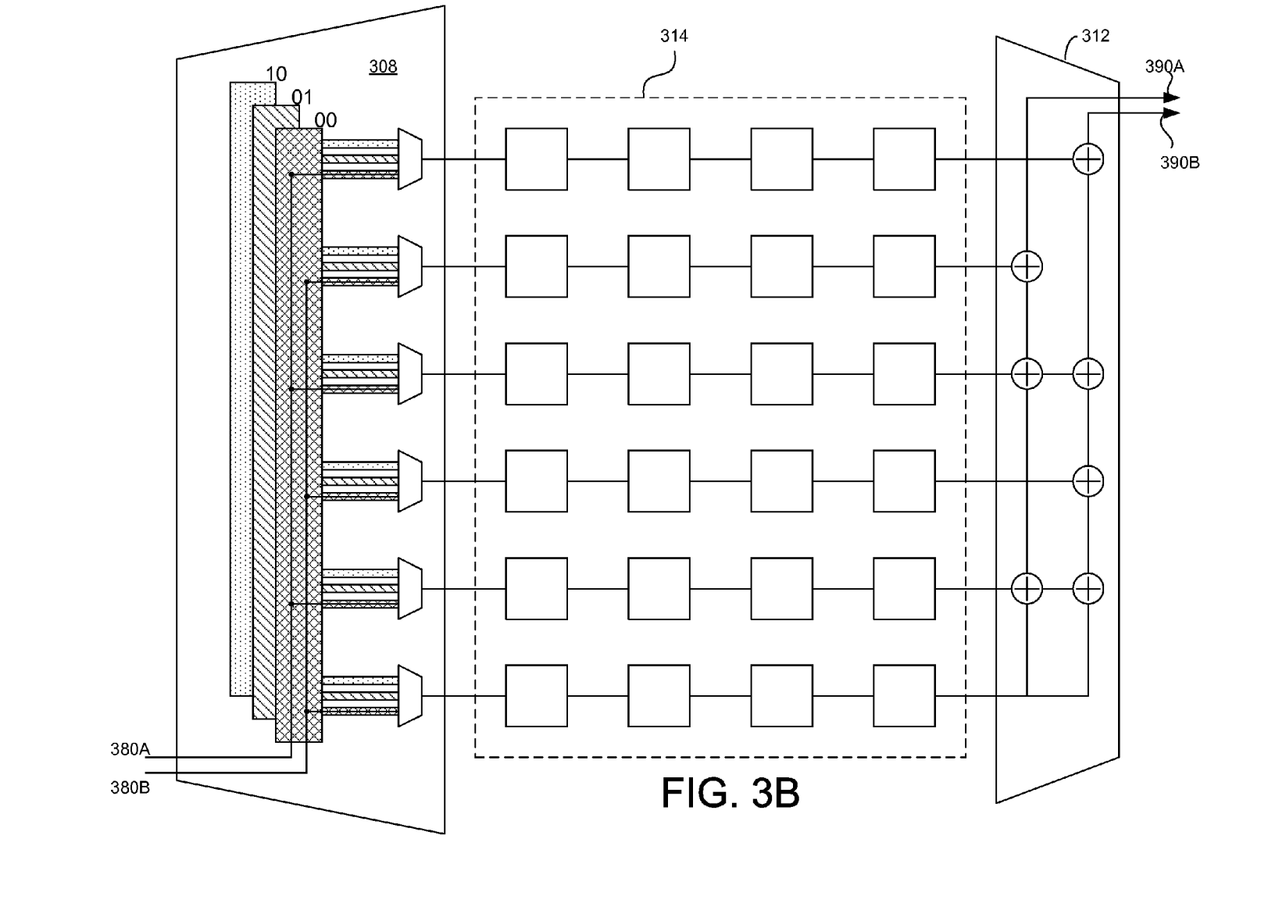
FIG. 3B is a conceptual diagram illustrating the operation of decompressor and compressor in a test circuit, according to one embodiment.

Decompressor 308 may operate in one of multiple modes as set by bit values in input mode control data registers 328 received via lines 356, 358. Each mode of decompressor 308 maps scan-in data to certain scan flops, as described below in detail with reference to FIG. 3B. Bit values in scan-in data registers may be provided to decompressor 308 in a forward direction (i.e., down-up direction) by input direction block 338 (as shown in FIG. 3B) or a reversed direction (i.e., up-down direction) based on the bit value provided by line 362.

Bit values in mask control data registers 322 of the current control registers 329 define the masking of certain scan chains. The bit values of mask control data registers 322 are provided to compressor 312 via lines 360. In response to receiving mask enable signal via line 352 and active signals in lines 360, a mask block 348 in compressor 312 masks certain scan chains as defined by the bit values of mask control data registers 322. The mask enable bit value stored in register 361 is sent to mask block 348 to enable or disable masking operation via line 352. Masking is done for the purpose of, for example, blocking scan chains capturing unknown values (referred to as "X") during unloading process.

A bit value in direction control data registers 326 of the current control registers 329 is sent to output direction block 340 via line 354 to control the direction of outputs from compressor 312. Outputs from scan flops 314 are exclusive OR (XOR) processed by compressor 312 to generate compressed outputs. These compressed outputs pass through the direction control logic 340 to register 344. The compressor outputs are stored in output registers 344. The bit values in output registers 344 are XOR processed into test output data 238. In the embodiment of FIG. 3A, the bit values in test output data 238 is output in a forward direction (i.e., top first and bottom last). However, the bit values in output registers may be output in a reverse direction (i.e., bottom first and top last) if the bit value received via line 354 is reversed.

Some of current control registers 329 store bit values for a current test pattern and other current control registers 329 store bit values for a previous test pattern preceding the current test pattern. Specifically, bit values in input mode control data registers 328 of current control registers 329, and a bit value in direction control data registers 326 of current control registers 329 controlling input direction block 338 for the scan-in data of the current test pattern are for the current test pattern. Conversely, bit value in direction control data registers 326 of current control registers 329 controlling output direction block 340 for the current test pattern, bit values in mask control data registers 322 of current control registers 329, a bit value in mask enable register 361 of current control registers 329 are for the previous test pattern. This mixture of control values at 329 is due to the fact that, while one pattern is being loaded through line 331, the previous pattern is being unloaded though line 239.

FIG. 3B is a conceptual diagram illustrating the operation of decompressor 308 and compressor 312 in a test circuit, according to one embodiment. Decompressor 308 may be selected to operate in one of the selected modes (labeled as "00", "01", and "10" in FIG. 3B) based on signals provided by lines 356, 358. Each mode may provide different mappings to route scan-in data 380A, 380B (only two bits of scan-in data are shown in FIG. 3B for simplification) received from scan-in data registers 318 to scan flops 314. This mapping provides an efficient way to handle dependencies of bit patterns to be applied to scan flops 314.

In compressor 312, the outputs from the rows of scan flops (i.e., scan chains) are XOR processed into fewer number of compressor outputs 390A, 390B. Outputs from each column of scan flops are fed sequentially to the compressor 312. Certain combinations of the outputs from the scan flops are XOR processed to generate compressor outputs 390A, 390B.

By compressing the outputs for the scan flops, the amount of data to be transmitted to ATE 120 and diagnostic tool 130 may be reduced. The disadvantage of compressing the outputs from the scan flops is that, when an unexpected value representing a fault occurs in the outputs 390A, 390B, the scan flop causing the fault may not be localized. Further test patterns or analysis may be needed to determine the exact scan flop associated with the fault.

For example, the compressor of FIG. 3B compresses the output of the test circuit into two output values 390A and 390B. Output 390A of FIG. 3B is the result of the XOR operation between the output of the first scan chain, the third scan chain, the fourth scan chain, the fifth scan chain and the sixth scan chain. Hence, an unexpected value in output 390A may originate from faults associated with any one or more of the first scan chain, the third scan chain, the fourth scan chain, the fifth scan chain and the sixth scan chain. Similarly, output 390B of FIG. 3B is the result of the XOR operation between the output of the second scan chain, the third scan chain, the fifth scan chain and the sixth scan chain. Hence, an unexpected value in output 390B may originate from faults associated with any one or more of the second scan chain, the third scan chain, the fifth scan chain and the sixth scan chain. In order to identify the exact scan chain and/or scan flop causing the unexpected values in the outputs, additional test patterns or analysis may be needed.

As described above with reference to FIG. 3A, mask block 348 is used for masking certain scan chains as defined by the bit values of mask control data registers 322. The masking is done to prevent propagation of unknown "X" values in certain scan chains. However, the probability of "X" values occurring in each scan chain may be different. For outputs from scan chains less likely to include "X" values, it is preferable to combine outputs from more scan chains for higher compression ratio. Conversely, for outputs from scan chains more likely to include "X" values, it is preferable to limit combination with outputs from other scan chains to prevent propagation of "X" values.

In one or more embodiments, the outputs from scan chains have a combination of multiple fanout and single fanout. Fanout of a scan chain described herein refers to the number of inputs of the compressor 312 which receives the output of the scan chain. For example, a scan chain with three fanout propagates the output of the scan chain to three inputs of the compressor 312. In this example, the output of the scan chain may fanout to input terminals of three other XOR gates in the compressor 312 for compression. Three fanout is generally understood as a good compromise between reasonable range of fault detection and reasonable degree of compression. However, different number of fanout (e.g., two fanout or four fanout) may also be used. The arrangement concerning which scan chains to have multiple fanout and single fanout as well as which scan chains should have dedicated control data bits are set by the control data, as described below in detail with reference to FIG. 4B.

Figure 4A:
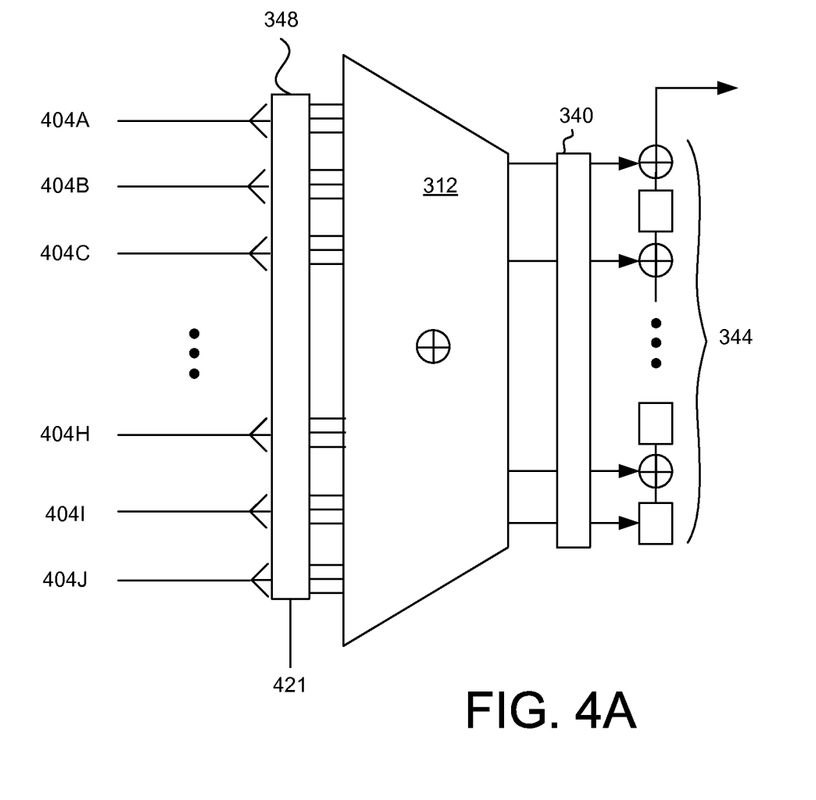
FIG. 4A is a diagram illustrating multiple fanout scan chains configurable by a mode control signal, according to one embodiment.

FIG. 4A is a diagram illustrating multiple fanout scan chains configurable by a mode control signal 421, according to one embodiment. The mode control signal 421 may be part of the mask control data stored in mask control data register 322 (refer to FIG. 3A). In the embodiment of FIG. 4A, the configuration of the scan chain fanout is changed based on the modes of operation as set by the mode control signal 421. Each mode sets different scan chains to fanout their output to multiple compressed outputs (i.e., multiple fanout) or single compressed output (i.e., single fanout) and assigns different scan chains to dedicated control bits of mask control data. The propagation of "X" values from an output of a scan chain can be limited by setting the scan chain to single fanout scan chain. Further, by differing the dedicated control bits, masking of scan chains can be finely controlled using a fewer number of mask control bits.

In one or more embodiments, two or more modes configure all of the scan chains to have multiple fanout (e.g., three fanout). In one of such modes, masking of adjacent scan chains is controlled by the same mask control bit. Taking the example of FIG. 4A, scan chains 404A through 404C are controlled by one mask control data bit and scan chains 404D through 404F are controlled by another mask control data bit. In another mode where all of the scan chains are configured to have multiple fanout, the mask control data bits for the scan chains are interleaved. That is, the mask control data bits controlling the masking of the scan chains alternate sequentially. For example, masking of outputs from scan chains 404A and 404D is controlled by a first mask control data bit, masking of outputs from scan chains 404B and 404E is controlled by a second mask control data bit, and masking of outputs from scan chains 404C and 404F is controlled by a third mask control data bit.

Other modes may set different scan chains to have multiple fanout while the remaining scan chains have single fanout. For example, one mode may set scan chains 404A through 404D to have three fanout while scan chains 404E through 404J have single fanout. In another mode where a subset of scan chains have multiple fanout may set scan chains 404E through 404H to have three fanout while scan chains 404A through 404D, 404I and 404J are set to have single fanout. The number of modes may be determined so that each scan chain is set to have single fanout in at least one mode.

In one or more embodiments, masking for each scan chain having the single fanout may be controlled by a dedicated mask control data bit while the masking of scan chains with multiple fanout may be controlled by shared mask control data bits. Taking the example where scan chains 404A through 404D have three fanout and scan chains 404E through 404J have single fanout, a first mask control data bit may control masking for scan chains 404A and 404C, a second mask control data bit may control masking for scan chains 404B and 404D, and each of third through eighth mask control data bits control masking for each of scan chains 404E through 404J.

During compression of the output of scan chains, unknown "X" values from one scan chain may be combined with valid outputs of other scan chains. To increase the likelihood that the output of a scan chain is reflected in the output of the compressor 312 without being affected by an unknown "X" value generated at an output of another scan chain, the output of the scan chain may have multiple fanout, that is, the outputs of the scan chain can be sent to multiple inputs of the compressor 312. However, it is to be noted that the scan chain with multiple fanout may also render outputs of other scan chains not observable if the scan chain itself produces an unknown "X" value. By changing the fanout of the scan chain, the observable range of scan outputs or the range that an unknown "X" affects the output of the compressor 312 an be controlled. Hence, it is advantageous to have different modes where the same scan chain has single fanout in some modes and the same scan chain has multiple fanout in some other modes.

Figure 4B:
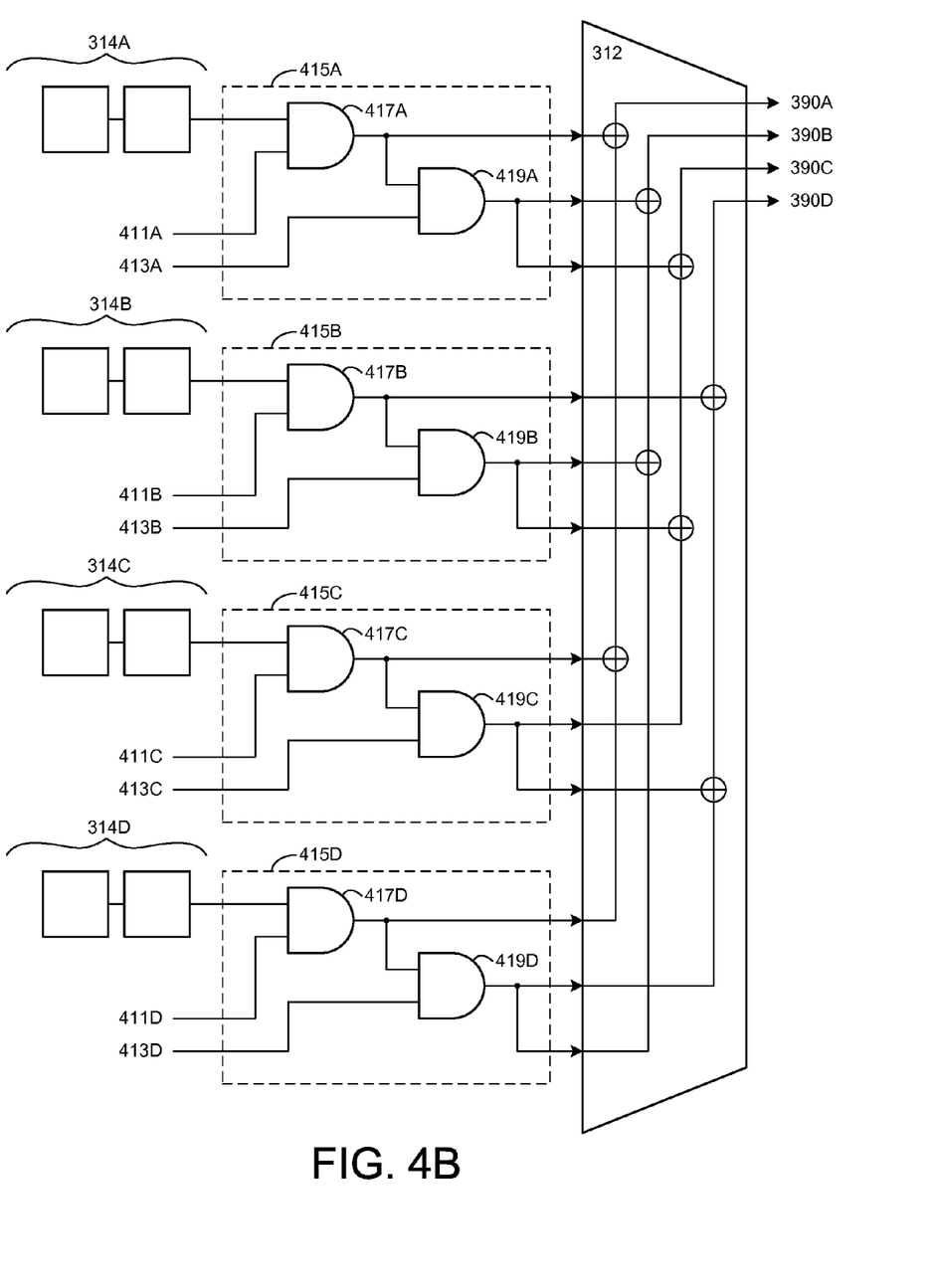
FIG. 4B is a diagram illustrating a test circuit with four scan chains that can be configured either with a single fanout or with a multiple fanout, according to one embodiment.

FIG. 4B is a diagram illustrating a test circuit with four scan chains that can be configured with either with single fanout or with multiple fanout, according to one embodiment. Although test circuit of FIG. 4B is illustrated as having four scan chains 314 for the sake of explanation, a larger number of scan chains 314 are likely to be provided in practical applications.

Each of scan chains is connected to one of fanning circuit 415A through 415D (hereinafter collectively referred to as "fanning circuits 415"). Each of the fanning circuits 415 receives the output of a scan chain 314 and a fanout control signal 413 and sends the output of the scan chain 314 to either one input of the compressor 312 or multiple inputs of the compressor 312 based on the received fanout control signal 413. Each of the fanning circuit 415 includes an AND gate 417 and an AND gate 419.

AND gate 417 masks the output of scan chain 314 based on a mask signal 411. When mask signal 411 is 0, AND gate 417 output a value of 0, thus blocking the output of scan chain 314 from reaching the compressor 312. When mask signal 411 is 1, AND gate 417 propagates the output of scan chain 314, thus allowing the output of the scan chain 314 from reaching the compressor 312 and the AND gate 419.

AND gate 419 receives fanout control signal 413 and controls the fanout of scan chain 314 based on the value of fanout control signal 413. In the embodiment of FIG. 4B, scan chain 314 has single fanout when fanout control signal is logically "0," and has fanout of three when fanout control signal 413 is logically "1." In other embodiments, scan chain 314 may have a different number of fanout when fanout control signal 413 is logically "1." For instance, when fanout control signal 413 is logically "1," scan chain 314A may have fanout of three while scan chain 314E (not illustrate) may have fanout of five.

Figure 5A:
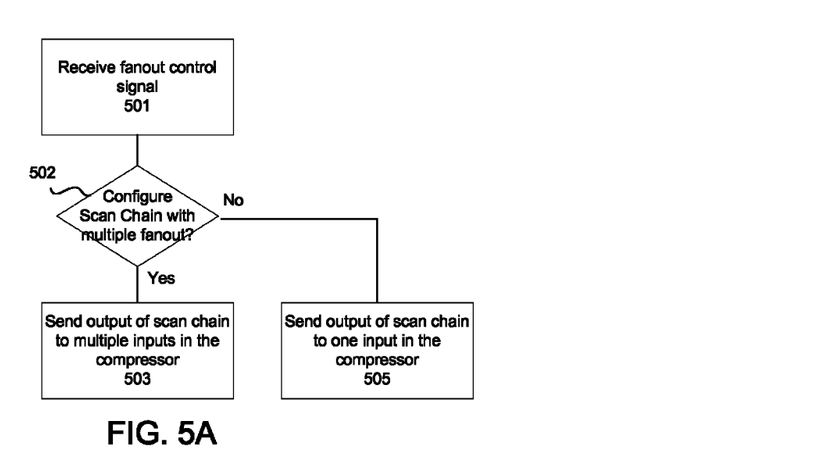
FIG. 5A is a flow diagram of a method for controlling the fanout of a scan chain, according to one embodiment.

FIG. 5A is a flow diagram of a method for controlling the fanout of a scan chain, according to one embodiment. First, a fanout control signal is received 501. The fanout control signal may, for example, be a binary signal that indicates whether to configure the scan chain as single fanout or as multiple fanout. If it is determined 502 that the fanout control signal indicates configuring of the scan chain as multiple fanout, the output of the scan chain is sent 503 to multiple inputs of the compressor 312. For example, the output of the scan chain may be sent 503 to three inputs of the compressor 312.

Conversely, if it is determined 502 that the fanout control signal indicates configuring of the scan chain as single fanout, the output of the scan chain is sent 505 to one input of the compressor 312. In some embodiments, the scan chain is configured as single fanout by enabling one output of the scan chain and disabling the other outputs of the scan chain (e.g., enabling one out of three output and disabling two out of three outputs of a scan chain that can be configured with either fanout of three or fanout of one).

Having multiple fanout increases the observability of the output of a scan chain 314. For instance, as illustrated in the embodiment of FIG. 4B, when mask signal 411A is 1, and fanout control signal 413A is logically "1," the output of scan chain 314A is propagated to three inputs of compressor 312, which propagates the output of scan chain 314A to compressor outputs 390A, 390B, and 390C. If unknown "X" values from other scan chains 314B, 314C, 314D propagate to at most two of the three compressor outputs 390A, 390B, and 390C, the output of the scan chain 314A would still be observable from at least one compressor output 390A, 390B, and 390C. However, having multiple fanout also increases the propagation of unknown "X" values if the scan chain with multiple fanout generates an unknown "X" value. For instance, an unknown "X" value of a scan chain with fanout of three propagates the unknown "X" value to three outputs of compressor 312. As such, it is advantageous to configure a scan chain to have single fanout of multiple fanout depending on whether the scan chain produces unknown "X" values or how likely it is for the scan chain to produce unknown "X" values.

Figure 4C:
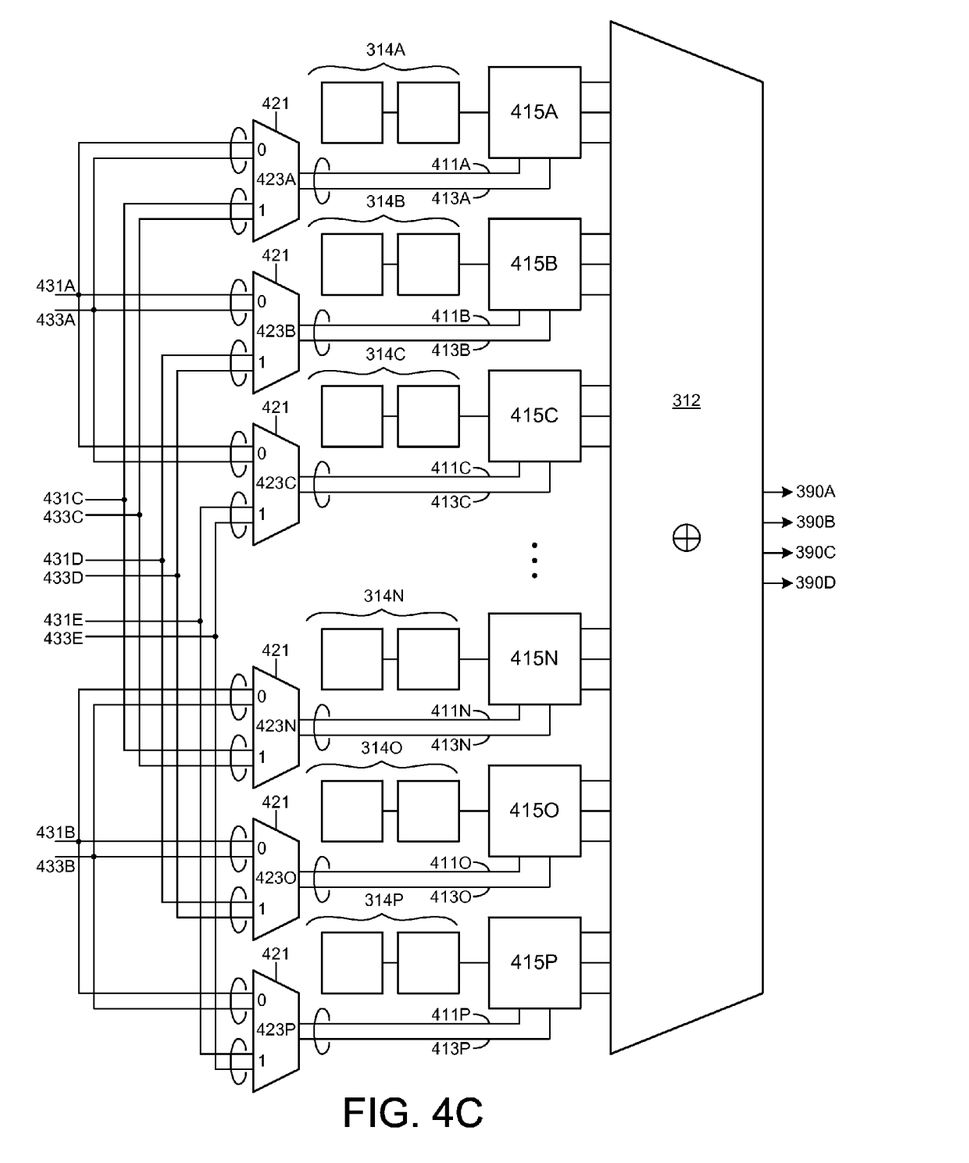
FIG. 4C is a diagram illustrating a test circuit that can be configured in one of two modes, according to one embodiment.

FIG. 4C illustrates a test circuit that can be configured in one of two modes, according to one embodiment. Although the test circuit 242 of FIG. 4C is illustrating as being configurable in one of two modes, test circuit 242 may be configurable in more than two modes (e.g., three modes). Each scan chain 314 includes a multiplexer 423 that selects mask signal 411 and fanout control signal 413 based on a mode selection signal 421. The test circuit 242 of FIG. 4C can be configured in a non-interleaving mode or in an interleaving mode.

In the embodiment of FIG. 4C, when mode selection signal 421 is 0, test circuit test circuit 242 is configured in a non-interleaving mode. When selection signal 421 is logically "0," multiplexers 423 propagate the mask signals 431 and fanout control signals 433 that are connected to the first input (inputs labeled "0" in the multiplexers 423 of FIG. 4C). Multiplexers 423A, 423B and 423C, associated with adjacent scan chains 314A, 314B, and 314C, propagate mask signal 431A and fanout control signal 433A; and multiplexers 423N, 423O and 423P, associated with adjacent scan chains 314N, 3140, and 314P, propagate mask signal 431B and fanout control signal 433B. Therefore, in the embodiment of FIG. 4C, when selection signal 421 is logically "0," adjacent scan chains 314A, 314B, and 314C are controlled by the same mask signal 431A and the same fanout control signal 433A, and adjacent scan chains 314N, 3140 and 314P are controlled by the same mask signal 431B and the same fanout control signal 433B.

When mode selection signal 421 is logically "1," test circuit 242 is configured in an interleaving mode. When selection signal 421 is 1, multiplexers 423 propagate the mask signals 431 and fanout control signals 433 that are connected to the second input (inputs labeled "1" in the multiplexers 423 of FIG. 4C). Multiplexers 423A and 423N (associated with scan chains 314A and 413N that are separated by a predetermined number of scan chains) propagate mask signal 431C and fanout control signal 433C, multiplexers 423B and 423O (associated with scan chains 314B and 4130 that are separated by a predetermined number of scan chains) propagate mask signal 431D and fanout control signal 433D, and multiplexers 423C and 423P (associated with scan chains 314C and 413P that are separated by a predetermined number of scan chains) propagate mask signal 431E and fanout control signal 433E. Therefore, in the embodiment of FIG. 4C, when selection signal 421 is logically "1," scan chains separated by a predetermined number of scan chains are controlled by the same mask signal 431 and fanout control signal 433.

In some embodiments, test circuit is configurable to operate in more than two modes. In such embodiments, multiplexers 423 may select mask signals 411 and fanout control signals 413 among more than two mask signals 431 and fanout control signals 433. For instance, mode control signal 421 may be a two bit signal and multiplexers 423 may select a mask signal 411 and a fanout control signal 413 from four mask signals 431 and fanout control signals 433.

Figure 5B:
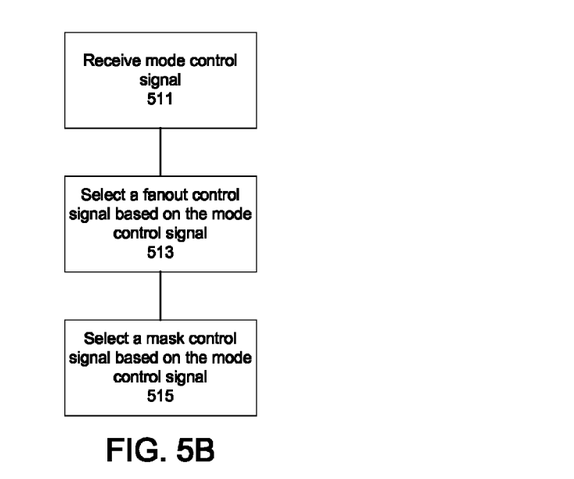
FIG. 5B is a flow diagram of a method for controlling the fanout of scan chains in a test circuit, according to one embodiment.

FIG. 5B is a flow diagram of a method for controlling the fanout of scan chains in a test circuit, according to one embodiment. The test circuit receives 511 a mode control signal indicating to configure the test circuit in one of many available modes. For instance, the mode control signal may indicate to configure the test circuit in one of 8 different modes. One mode may, for example, configure the scan chains of the test circuit as multiple fanout and controls the masking of the scan chains in an interleaving manner. Other modes may configure a first set of scan chains as multiple fanout and a second set of scan chains as single fanout, and control the masking of scan chains configured as multiple fanout with a shared mask control signal and control the masking of each of the scan chains configured as single fanout with dedicated mask control signal. The fanout of the scan chains of the test circuit are configured based on the received mode control signal. The fanout of the scan chains may, for example, be configured by selecting 513 a fanout control signal for each of the scan chains in the test circuit based on the received mode control signal. The test circuit selects 515 a mask control signal for each of the scan chains based on the received mode control signal.

In one or more embodiments, dynamic masking may be performed to manage the "X" values more efficiently by enabling or disabling the mask for each shift of the test pattern instead of applying the same masking for an entire shift cycle of the test pattern. When the diagnostic tool 130 determines that "X" values are distributed in certain part of the scan chain, the diagnostic tool 130 can cause the scan chains producing "X" values to be dynamically masked based on the test output 238 received at the diagnostic tool 130. In this way, the observability of the scan chain outputs is improved and the compressor 312 can perform compression more efficiently.

To achieve such dynamic masking, a separate pin for receiving bit stream for dynamically enabling or disabling masking of the scan chains may be provided on the integrated circuit to receive the signal from the diagnostic tool 130. Each bit in the bit stream may define whether masking of scan chains should be enabled or disabled at a certain shift position of the test pattern.

In one or more embodiments, a control bit for loading or bypassing mask control data registers 322 is provided in the test pattern. When "X" values are well-defined and predictable, the same mask control data may be used across multiple adjacent test patterns. Including the same set of mask control bits multiple times in the test pattern in such circumstances unnecessarily increases the overhead of the scan-in data. Hence, a control bit (not shown) may be provided to indicate whether the data in the mask control data registers 322 should be retained or reloaded. When the control bit indicates retaining of the mask control bits, the mask control bits of the previous test pattern is used in the current test pattern, and the redundant mask control bits can be obviated from the scan-in data. By removing the redundant mask control bits in the test patterns, the overhead of the test patterns can be reduced.

Figure 6A:
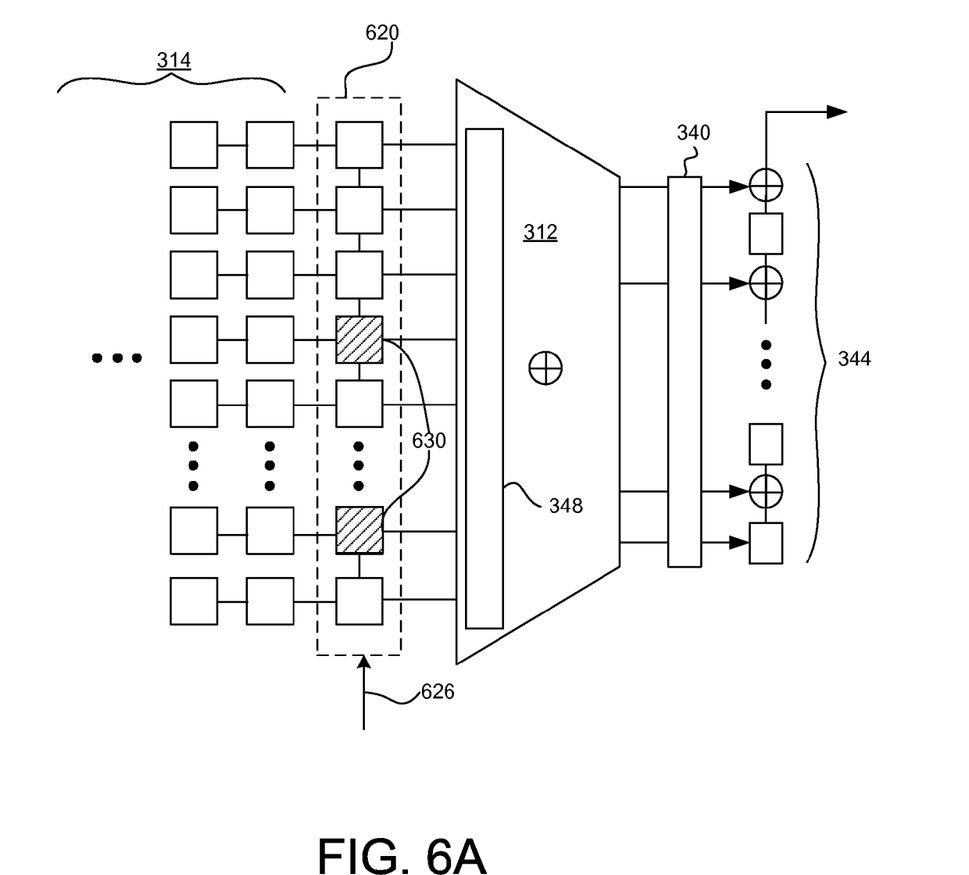
FIG. 6A is a diagram illustrating a test circuit with control scan chain registers added between scan chain outputs and a mask, according to one embodiment.

FIG. 6A is a diagram illustrating a test circuit with control scan chain blocks 620 added between scan chains 314 and compressor 312, according to one embodiment. The control scan chain blocks 620 are loaded with control bits 626 to configure the fanout of scan chains. In some embodiments, control scan registers 620 are loaded during the setup of the test circuit 242 and remains unchanged throughout the testing of DUT 124. In other embodiments, scan registers 620 are refreshed with new values when the test circuit 242 receives an enable signal (not shown). Such enable signal may be received after a number of test patterns are received from the ATPG/FS 104.

Control bits 626 may configure the fanout of scan chains 314 as single fanout or multiple fanout for the duration of the testing of DUT 124, or until a new set of control bits 626 are loaded into control scan registers 620. For instance scan chains that contains "X" values may be configured for the duration of a test to have a single fanout, while scan chains that have no "X" values may be configured to have a multiple fanout.

Figure 6B:
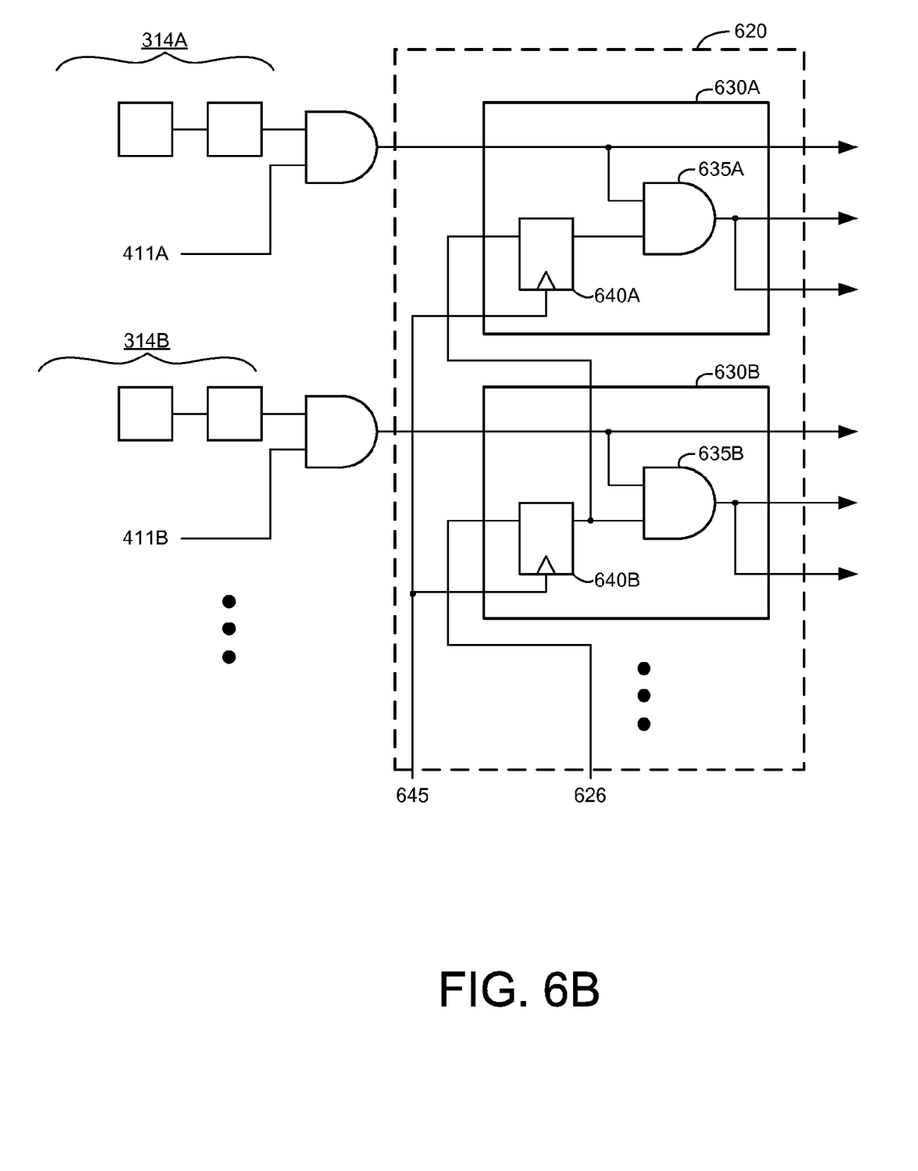
FIG. 6B is a diagram illustrating scan chains to have fanout as set by fanout control registers, according to one embodiment.

FIG. 6B is a diagram illustrating scan chains to have fanout as set by fanout control registers, according to one embodiment. Each scan chain is coupled to one scan chain control block 630A, 630B (hereinafter collectively referred to as "scan chain control block 630"). Each of the scan chain control block 630 includes an AND gate 635 and a fanout control register 640. Each scan chain control block 630 receives the output of a scan chain 314 and sends the output of the scan chain 314 to either a single input of the compressor 312 or multiple inputs of the compressor 312 based on value stored in fanout control register 640. For instance, in the embodiments of FIG. 6B, fanout control register 640A stores a value of "0," causing scan chain 314A to have a single fanout while fanout control register 640B stores a value of "1," causing scan chain 314B to have multiple fanout.

Fanout control registers 640 may be sequentially loaded with control bits 626 by sending a clock signal through line 645. A clock signal may, for example, be sent though line 645 by combining a clock signal CLK of test circuit 242 with an enable signal (not shown). Once the fanout control registers 640 are loaded with their respective control bits, the enable signal is turned off until a new set of control signals 626 are to be loaded into fanout control registers 640.

Figure 7:
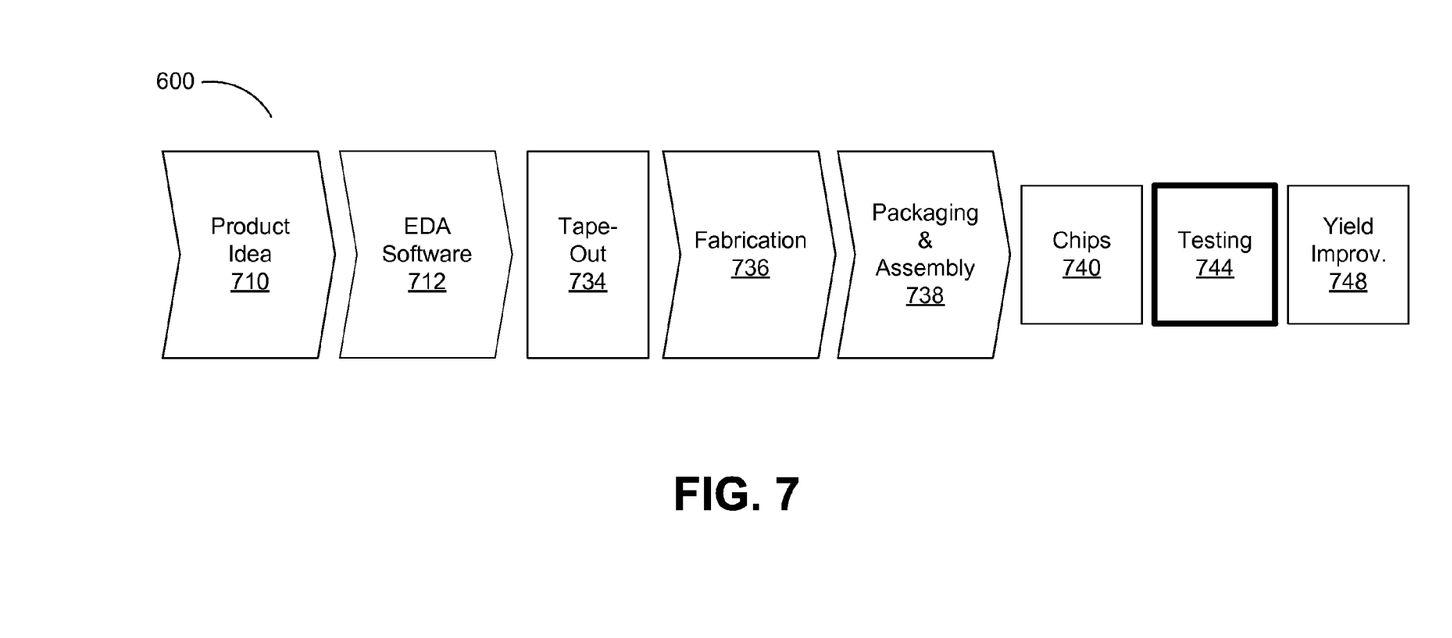
FIG. 7 is flow diagram illustrating the various operations in the design and fabrication of an integrated circuit, according to one embodiment.

FIG. 7 is a flowchart 700 illustrating the various operations in the design and fabrication of an integrated circuit. This process starts with the generation of a product idea 610, which is realized during a design process that uses electronic design automation (EDA) software 712. When the design is finalized, it can be taped-out 734. After tape-out, a semiconductor die is fabricated 736 to form the various objects (e.g., gates, metal layers, vias) in the integrated circuit design. Packaging and assembly processes 638 are performed, which result in finished chips 740. Chips are then tested 644 to detect faults. Based on the detected faults in the tested chips, measures can be taken to improve yield 648 in subsequent batch of chips to be fabricated. Embodiments described above primarily related to testing 644 the chips for faults.

Figure 8:
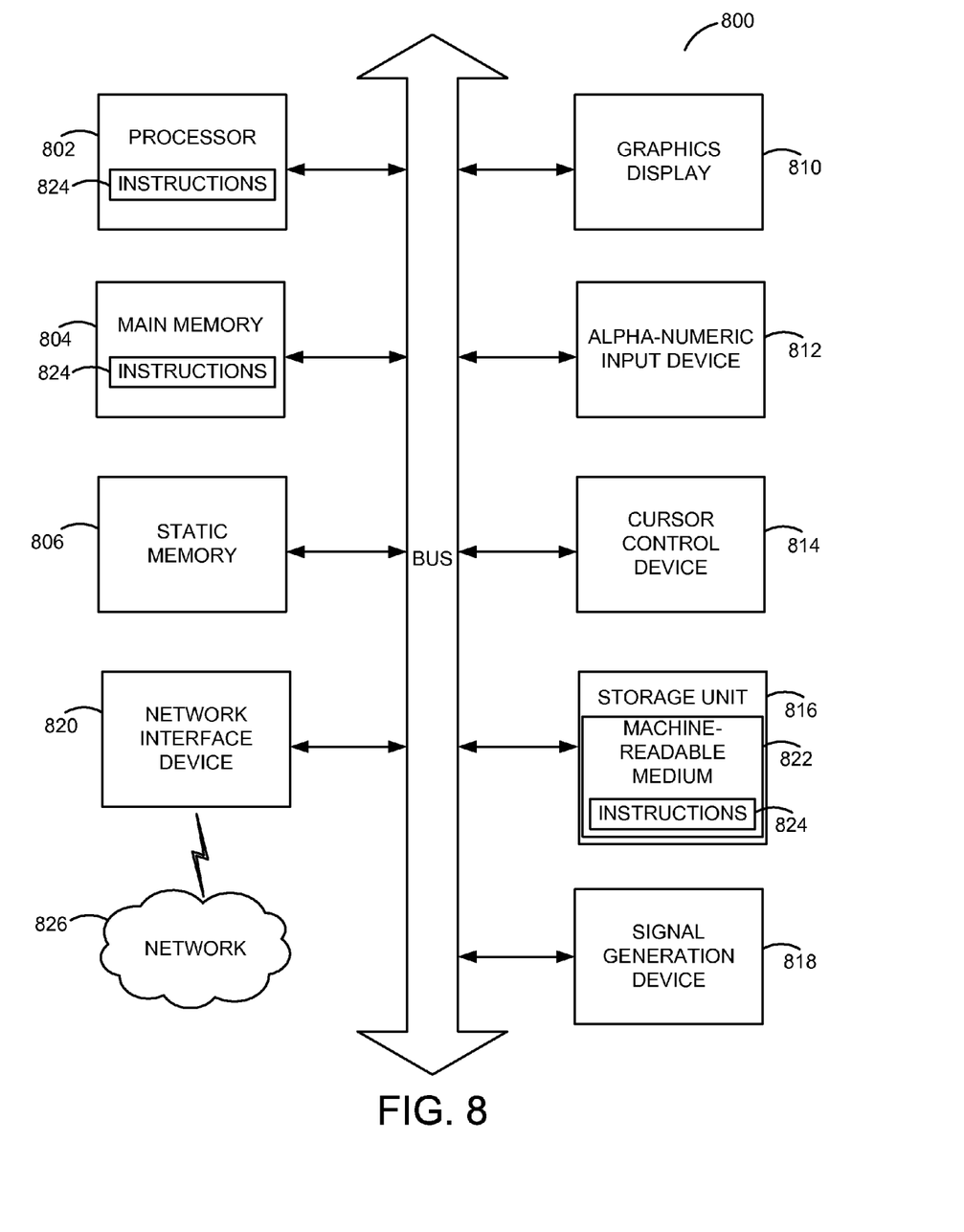
FIG. 8 is a block diagram illustrating components of a machine able to read instructions from a machine-readable medium and execute them in a processor, according to one embodiment.

FIG. 8 is a block diagram illustrating components of an example machine able to read instructions from a machine-readable medium and execute them in a processor (or controller). Specifically, FIG. 8 shows a diagrammatic representation of a machine in the example form of a computer system 800 within which instructions 824 (e.g., software) for causing the machine to perform any one or more of the methodologies discussed herein may be executed. The computer system 800 may be used to perform operations associated with designing a test circuit including a plurality of test core circuits arranged in a hierarchical manner.

The example computer system 800 includes a processor 802 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 804, and a static memory 806, which are configured to communicate with each other via a bus 808. The computer system 800 may further include graphics display unit 810 (e.g., a plasma display panel (PDP), a liquid crystal display (LCD), a projector, or a cathode ray tube (CRT)). The computer system 800 may also include alphanumeric input device 812 (e.g., a keyboard), a cursor control device 814 (e.g., a mouse, a trackball, a joystick, a motion sensor, or other pointing instrument), a storage unit 816, a signal generation device 818 (e.g., a speaker), and a network interface device 820, which also are configured to communicate via the bus 808.

The storage unit 816 includes a machine-readable medium 822 on which is stored instructions 824 (e.g., software) embodying any one or more of the methodologies or functions described herein. The instructions 824 (e.g., software) may also reside, completely or at least partially, within the main memory 804 or within the processor 802 (e.g., within a processor's cache memory) during execution thereof by the computer system 800, the main memory 804 and the processor 802 also constituting machine-readable media. The instructions 824 (e.g., software) may be transmitted or received over a network 826 via the network interface device 820. The machine-readable medium 822 may also store a digital representation of a design of a test circuit.

While machine-readable medium 822 is shown in an example embodiment to be a single medium, the term "machine-readable medium" should be taken to include a single medium or multiple media (e.g., a centralized or distributed database, or associated caches and servers) able to store instructions (e.g., instructions 824). The term "machine-readable medium" shall also be taken to include any medium that is capable of storing instructions (e.g., instructions 824) for execution by the machine and that cause the machine to perform any one or more of the methodologies disclosed herein. The term "machine-readable medium" includes, but not be limited to, data repositories in the form of solid-state memories, optical media, and magnetic media.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

While particular embodiments and applications have been illustrated and described, it is to be understood that the embodiments are not limited to the precise construction and components disclosed herein and that various modifications, changes and variations may be made in the arrangement, operation and details of the method and apparatus disclosed herein without departing from the spirit and scope of this disclosure.

What is claimed is:

1. A method for operating a test circuit of an integrated circuit, comprising:
   receiving, by the test circuit, a fanout control signal for configuring fanout of a scan chain;
   responsive to the fanout control signal indicating configuring of the scan chain as a single fanout, sending an output of the scan chain to one input of a compressor for compression; and
   responsive to the fanout control signal indicating configuring of the scan chain as a multiple fanout, sending the output of the scan chain to three or more inputs of the compressor for compression.

2. The method of claim 1, wherein sending the output of the scan chain to one input of the compressor comprises disabling all but one output of the scan chain responsive to the fanout control signal indicating configuring of the scan chain as the single fanout.

3. The method of claim 1, further comprising selecting one of a plurality of modes of operating the test circuit, each of the plurality of modes setting a different combinations of first scan chains with the single fanout and second scan chains with the multiple fanout.

4. The method of claim 3, wherein the fanout control signal is generated at the test circuit responsive to receiving a mode control signal at the test circuit, the mode control signal indicating the one of the plurality of modes to be selected.

5. The method of claim 4, further comprising:
   generating a mask control signal for the scan chain corresponding to the received mode control signal; and
   masking the output of the scan chain based on the selected mask control signal.

6. The method of claim 4, further comprising:
   generating fanout control signals for other scan chains corresponding to the received mode control signal to configure fanout of the other scan chains, at least one of the other scan chains set to have a single fanout by the fanout control signals; and
   generating mask control signals for the other scan chains corresponding to the received mode control signal, a mask control signal dedicated to each of the at least one of the other scan chains set to have the single fanout.

7. The method of claim 4, further comprising:
   generating fanout control signals for other scan chains corresponding to the received mode control signal to configure fanout of the other scan chains, at least one of the other scan chains set to have a single fanout by the fanout control signals; and
   generating mask control signals for the other scan chains corresponding to the received mode control signal, a mask control signal shared by a subset of scan chains that are separated by a predetermined number of the scan chains.

8. The method of claim 4, further comprising:
generating fanout control signals for other scan chains corresponding to the received mode control signal to configure fanout of the other scan chains, at least one of the other scan chains set to have a single fanout by the fanout control signals; and
generating mask control signals for the other scan chains corresponding to the received mode control signal, a mask control signal shared by a predetermined number of adjacent scan chains.

9. The method of claim 1, further comprising:
receiving a mask enable signal configured to enable or disable masking of an output of the scan chain to the compressor for each shift of a test pattern fed to the scan chain; and
masking the output of the scan chain responsive to the mask enable signal being active and based on the mask control signal and the mask enable signal.

10. The method of claim 7, wherein the mask enable signal is received via a dedicated pin of the integrated circuit during testing of the integrated circuit.

11. The method of claim 1, further comprising storing a value representing the single fanout or the multiple fanout in a fanout control register associated with the scan chain, the fanout of the scan chain set by reading the value from the fanout control register.

12. A test circuit in an integrated circuit comprising:
a plurality of scan chains, each scan chain configured to generate scan chain outputs representing test responses of a subset of sub-circuits of the integrated circuit;
a compressor configured to compress the scan chain outputs of the plurality of scan chains; and
a fanout circuit between at least one of the plurality of the scan chains and the compressor, the fanout circuit configured to set a fanout of the scan chain based on a fanout control signal, the fanout circuit configured to send a scan chain output of the at least one scan chain to one input of the compressor for compression responsive to the fanout control signal indicating configuring of the at least one scan chain as a single fanout, and send the scan chain output of the at least one scan chain to three or more inputs of the compressor for compression responsive to the fanout control signal indicating configuring of the scan chain as a multiple fanout.

13. The test circuit of claim 12 wherein the fanout circuit comprises an AND gate for disabling all but one output of the scan chain responsive to the fanout control signal indicating configuring of the scan chain as the single fanout.

14. The test circuit of claim 12 further comprising:
a multiplexer coupled to the fanout circuit for selecting the fanout control signal based on a mode control signal.

15. The test circuit of claim 12 further comprising:
a multiplexer coupled to the fanout circuit for selecting a mask control signal based on a mode control signal;
a masking circuit coupled to the output of the scan chain for masking the output of the scan chain based on the selected mask control signal.

16. The test circuit of claim 15 wherein:
the mask control signal dedicated to the at least one scan chain responsive to the scan chain having a single fanout; and
the mask control signal shared between the at least one scan chain and other scan chains responsive to the at least one scan chain having multiple fanout.

17. The test circuit of claim 12, wherein the fanout circuit comprises fanout control registers, each fanout control register configured to store a value representing the single fanout or the multiple fanout of an associated scan chain.

18. A non-transitory computer readable medium storing data representing a test circuit in an integrated circuit, the test circuit comprising:
a plurality of scan chains, each scan chain configured to generate scan chain outputs representing test responses of a subset of sub-circuits of the integrated circuit;
a compressor configured to compress the scan chain outputs of the plurality of scan chains; and
a fanout circuit between at least one of the plurality of the scan chains and the compressor, for the fanout circuit configured to set a fanout of the scan chain based on a fanout control signal, the fanout circuit configured to send a scan chain output of the at least one scan chain to one input of the compressor for compression responsive to the fanout control signal indicating configuring of the at least one scan chain as a single fanout, and send the scan chain output of the at least one scan chain to three or more inputs of the compressor for compression responsive to the fanout control signal indicating configuring of the scan chain as a multiple fanout.

19. The non-transitory computer readable medium of claim 18, wherein the test circuit further comprises:
a multiplexer coupled to the fanout circuit for selecting a mask control signal based on a mode control signal;
a masking circuit coupled to the output of the scan chain for masking the output of the scan chain based on the selected mask control signal.

20. A non-transitory computer readable storage medium storing instructions thereon, the instructions when executed by a processor in an automatic test pattern generator (ATPG), cause the processor to:
generate a first fanout control signal to configure a scan chain in a test circuit to send an output of the scan chain to one input of a compressor of the test circuit for compression; and
generate a second fanout control signal to configure the scan chain to send the output of the scan chain to three or more inputs of the compressor.

* * * * *